United States Patent
Kawamura et al.

(10) Patent No.: US 9,063,554 B2
(45) Date of Patent: Jun. 23, 2015

(54) SIGNAL DETERMINATION APPARATUS AND TEMPERATURE DETERMINATION APPARATUS

(75) Inventors: Yoshihiro Kawamura, Makinohara (JP); Susumu Yamamoto, Makinohara (JP); Mitsuteru Yano, Wako (JP)

(73) Assignees: YAZAKI CORPORATION, Tokyo (JP); HONDA MOTOR CO., LTD., Tokyo (JP)

( * ) Notice: Subject to any disclaimer, the term of this patent is extended or adjusted under 35 U.S.C. 154(b) by 439 days.

(21) Appl. No.: 13/161,002

(22) Filed: Jun. 15, 2011

(65) Prior Publication Data

US 2011/0310928 A1  Dec. 22, 2011

(30) Foreign Application Priority Data

Jun. 16, 2010  (JP) .................. P2010-137275

(51) Int. Cl.

| | |
|---|---|
| *G01K 7/22* | (2006.01) |
| *G01K 7/25* | (2006.01) |
| *G05D 23/19* | (2006.01) |
| *G01K 7/24* | (2006.01) |
| *G01K 15/00* | (2006.01) |
| *H03M 1/12* | (2006.01) |

(52) U.S. Cl.
CPC ........ *G05D 23/19* (2013.01); *G01K 7/24* (2013.01); *G01K 15/007* (2013.01); *G01K 2219/00* (2013.01); *H03M 1/12* (2013.01)

(58) Field of Classification Search
CPC .............. G01K 1/20; G01K 7/22; G01K 7/25

USPC ......... 374/100, 170, 183, 185, 163, 141, 5, 4, 374/57, 178; 702/130, 136, 132; 327/512, 327/513, 333, 334, 76.11

See application file for complete search history.

(56) References Cited

U.S. PATENT DOCUMENTS

| | | | | |
|---|---|---|---|---|
| 4,031,365 A | * | 6/1977 | Raggiotti et al. | 702/131 |
| 4,227,411 A | * | 10/1980 | Abramovich | 73/335.02 |
| 4,430,540 A | * | 2/1984 | Scalf | 219/720 |
| 4,536,851 A | * | 8/1985 | Germanton et al. | 702/131 |
| 4,575,806 A | * | 3/1986 | Aldrich et al. | 702/133 |
| 5,161,893 A | * | 11/1992 | Shigezawa et al. | 374/181 |
| 5,611,952 A | * | 3/1997 | Jones | 219/505 |
| 5,764,094 A | * | 6/1998 | Hatsuda | 327/333 |
| 6,088,662 A | * | 7/2000 | Flinsbaugh et al. | 702/132 |
| 6,483,371 B1 | * | 11/2002 | Duthie et al. | 327/512 |
| 6,937,847 B2 | * | 8/2005 | Ehrenreich et al. | 455/115.1 |

(Continued)

FOREIGN PATENT DOCUMENTS

| | | |
|---|---|---|
| JP | 2003-121270 | 4/2003 |
| JP | 2007-121074 | 5/2007 |

*Primary Examiner* — Gail Kaplan Verbitsky

(74) *Attorney, Agent, or Firm* — Morgan, Lewis & Bockius LLP

(57) ABSTRACT

A temperature determination apparatus includes a signal detection section having an A/D input port, a thermistor that is connected to the A/D input port and outputs an analog signal to the A/D input port, and a switch section that shifts a level of the analog signal to a low level. The signal detection section determines that a control signal having a priority higher than that of an output detection process of the thermistor is generated when it is detected that the analog signal to be input to the A/D input port is in the low level.

6 Claims, 4 Drawing Sheets

(56) References Cited

U.S. PATENT DOCUMENTS

| | | | |
|---|---|---|---|
| 7,075,847 B2* | 7/2006 | Kim et al. | 365/222 |
| 7,089,146 B1* | 8/2006 | D'Aquino et al. | 702/132 |
| 7,104,684 B2* | 9/2006 | Felder | 374/178 |
| 7,341,374 B2* | 3/2008 | Chiu | 374/1 |
| 7,441,949 B2* | 10/2008 | Janzen et al. | 374/171 |
| 2003/0006822 A1* | 1/2003 | Murakami et al. | 327/513 |
| 2007/0216468 A1* | 9/2007 | Duarte | 327/513 |
| 2012/0232716 A1* | 9/2012 | Janzen et al. | 700/300 |
| 2014/0341257 A1* | 11/2014 | Bernardinis | 374/178 |

\* cited by examiner

| A/D INPUT RANGE |
|---|
| Vmax — THERMISTOR CIRCUIT OPENING MALFUNCTION |
| Vth11 — |
| NORMAL OPERATION RANGE OF THERMISTOR CIRCUIT IN PRIORITY DIGITAL SIGNAL OFF STATE |
| Vth12 — |
| ABNORMALITY OF THERMISTOR |
| Vth13 — |
| NORMAL OPERATION RANGE OF THERMISTOR CIRCUIT IN PRIORITY DIGITAL SIGNAL ON STATE |
| 0 |

← PRIORITY DIGITAL SIGNAL WITH ON LEVEL

SIGNAL DETERMINATION APPARATUS AND TEMPERATURE DETERMINATION APPARATUS

BACKGROUND

The present invention relates to a signal determination apparatus that determines an analogue signal and a temperature determination apparatus that performs determination of a temperature based on an analogue signal of a thermistor.

In a case where various kinds of controls are performed by detecting a signal, a microcomputer is often used as a control circuit. Usually, I/O ports of the control circuit (the microcomputer) of which the number corresponds to the number of input and output signals to be used are required.

Therefore, sometimes, it is not possible to perform efficient reduction of the number of pins in a case where a ready-made microcomputer is used. In a case where, for example, a microcomputer having 20 pins is expected to be used and the number of I/O ports necessary for implementation is greater than the number of I/O ports specified for the microcomputer by one, it may happen that a microcomputer having 30 pins, which is one-rank upper than the microcomputer having 20 pins, have to be used. This may cause not only increase of the cost, but also 9 pins of unused terminals to be wasted, and the unused terminals may cause an erroneous operation due to noise or the like. Therefore, a technique of sharing of a signal line or an I/O port has been offered.

For example, Patent Document 1 discloses a technique of a microcomputer in which a pulse signal of an encoder and a temperature signal of an inner part of the encoder are acquired by a single signal line drawn from the encoder without increasing the number of signal lines. In the technique, when detection of a temperature of the encoder is requested to a CPU of a controller to which the encoder is connected, the CPU detects a binary voltage of a signal input to a first port of the CPU via a signal line. When the binary voltage is in a high level, a second port of the CPU is connected to the ground. A voltage division resistor is provided in a preceding stage of the second port of the CPU. The CPU measures a voltage of an A/D input port different from the first and second ports so as to compute the temperature of the encoder based on a voltage value of the voltage of the A/D input port. At that time, a voltage Va divided by a resistance value of a thermistor and a resistance value of the voltage division resistor is input to the A/D input port of the CPU. The CPU computes the resistance value of the thermistor based on the voltage value of the voltage Va and calculates out the temperature of the inner part of the encoder based on a characteristic curve of the thermistor.

In another technique, Patent Document 2 discloses to fetch signals of a plurality of thermistors into an A/D port by a selecting operation of the thermistors by virtue of a single switching operation.

Patent Document 1: JP-A-2007-121074
Patent Document 2: JP-A-2003-121270

Meanwhile, it is possible to reduce the number of signal lines drawn from the encoder by the technique disclosed in Patent document 1. That is, the technique is effective to a case where a plurality of pieces of data are superposed in the signal of the inner part of the encoder. However, there is no description about a technique that the signal of the inner part of the encoder is in common use with a signal from another device. Therefore, another technique is required. In addition, the technique disclosed in Patent document 2, relates to detection of a signal from a device, the signal having an analogue signal characteristic, i.e., detection of a temperature. However, Patent document 2 does not teach a function of detecting signals having an analogue signal and a digital signal which are mixed therein at a single port.

SUMMARY

The invention is made in view of the above circumstances, and the purpose of the invention is to provide a technique capable of solving the above problems.

In order to achieve the above object, according to the present invention, there is provided a temperature determination apparatus, comprising:

a signal detection section having an A/D input port;
a thermistor that is connected to the A/D input port and outputs an analogue signal to the A/D input port; and
a switch section that shifts a level of the analogue signal to a low level, wherein the signal detection section determines that a control signal having a priority higher than that of an output detection process of the thermistor is generated when it is detected that the analogue signal to be input to the A/D input port is in the low level.

Preferably, the signal detection section determines that the control signal having the priority is not generated and the thermistor is in an abnormal high temperature state, when it is detected that a speed of change in the level of the analogue signal to the low level is lower than a first threshold value.

According to the present invention, there is also provided a temperature determination apparatus, comprising:

a signal detection section having an A/D input port;
a thermistor that is connected to the A/D input port and outputs an analogue signal to the A/D input port; and
a level shift section that shifts a level of the analog signal output from the thermistor to in a second level range which is different from a first level range on the basis of a priority signal for performing a priority process having a priority higher than that of an output detection process of the thermistor;

wherein the output detection process of the thermistor is performed when it is detected that the analog signal is within the first level range under a condition that the priority signal is absent; and wherein the signal detection section determines that a control signal having a priority higher than that of the output detection process of the thermistor is generated when it is detected that the level of the analog signal output from the thermistor is within the second level range, and performs the output detection process of the thermistor by referring to a table or a calculation formula corresponding to the second level range.

Preferably, the thermistor outputs the analogue signal based on a resistance value obtained by adding a resistance value of a first resistor connected to the thermistor in series to a resistance value of the thermistor, the level shift section includes a series circuit having an FET for shifting the level of the analog signal and a second resistor which are connected in series to each other, and one end of the series circuit is connected to an output terminal of the thermistor, and the other end of the series circuit is connected to a node having an electric potential with a low level.

Preferably, a resistance value of the first resistor and a resistance value of the second resistor are set so that there is no overlapped range between the first level range and the second level range.

Preferably, the resistance value of the first resistor and the resistance value of the second resistor are set so that a third level range having a predetermined level width is provided between the first level range and the second level range, and the signal detection section determines that the thermistor is in an abnormal high temperature state when it is detected that the analog signal output from the thermistor is within the third level range under a condition that the FET is in an OFF state.

According to the present invention, there is also provided a signal determination apparatus, comprising:

a signal detection section having an A/D input port;

an analogue signal generation section that is connected to the A/D input port and outputs an analogue signal to the A/D input port; and a switch section that shifts a level of the analogue signal output from the analogue signal generation section to a low level, wherein the switch section switches to connect an output terminal of the analogue signal generation section to a node having an electric potential with the low level when the switch section is operated by a control signal for a priority process having a priority higher than that of an output detection process of the analogue signal generation section.

According to the present invention, there is also provided a signal determination apparatus, comprising:

a signal detection section having an A/D input port;

an analogue signal generation section that is connected to the A/D input port and outputs an analogue signal to the A/D input port; and a level shift section that shifts a level of the analog signal output from the analogue signal generation section to in a second level range which is different from a first level range on the basis of a priority signal for performing a priority process having a priority higher than that of an output detection process of the analogue signal generation section;

wherein the output detection process of the analogue signal generation section is performed when it is detected that the level of the analog signal is within the first level range under a condition that the priority signal is absent; and wherein the signal detection section determines that a control signal having a priority higher than that of the output detection process of the analogue signal generation section is generated when it is detected that the level of the analog signal is within the second level range, and performs the output detection process of the analogue signal generation section by referring to a table or a calculation formula corresponding to the second level range.

Advantage of the Invention

With the configurations, in an IC such as a microcomputer or the like having an A/D conversion processing function, an analogue signal and a digital signal are processed by an identical A/D port so that it is possible to miniaturize the IC by reduction of the number of pins.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Embodiments for carrying out the invention are described below with reference to the accompanying drawings.

First Embodiment

Figure 1:
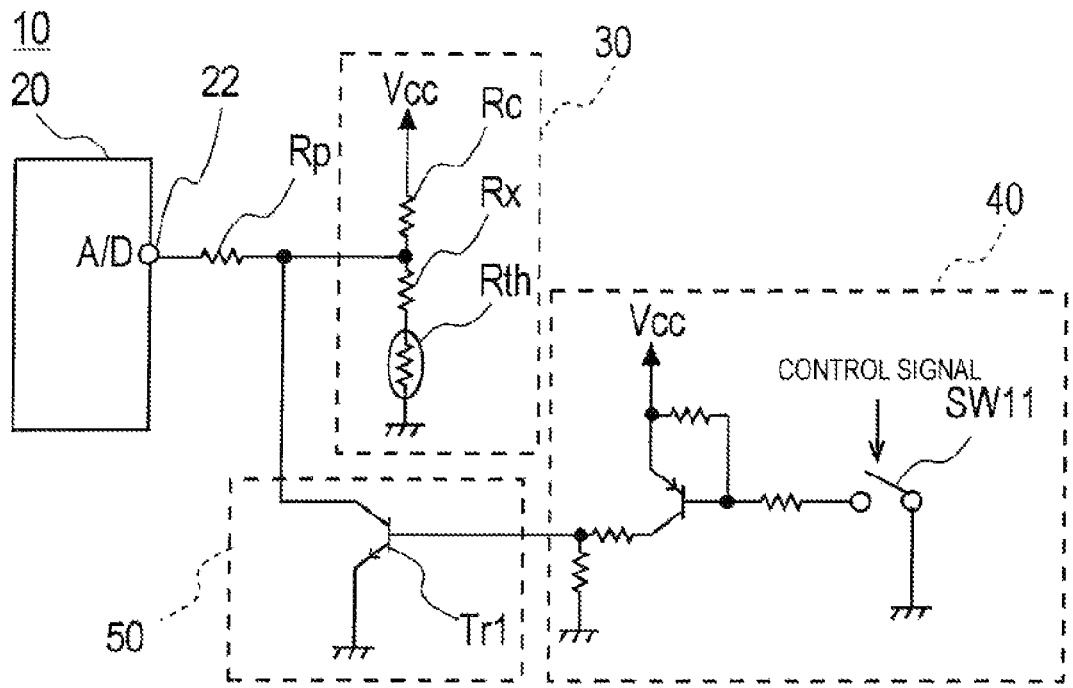
FIG. 1 is a functional block diagram typically showing a temperature determination apparatus according to a first embodiment of the invention.

FIG. 1 is a functional block diagram typically showing a temperature determination apparatus 10 according to the first embodiment. The temperature determination apparatus 10 includes a determination section 20, a temperature detection section 30, a priority signal generation section 40 and a level shift section 50.

The determination section 20 is configured by a microcomputer having an A/D conversion function. The determination section 20 has an A/D port 22 as a terminal for fetching an analogue signal from an external device.

The temperature detection section 30 has a thermistor Rth, a level adjustment resistor Rc and a voltage division adjustment resistor Rx. Here, the level adjustment resistor Rc, the voltage division adjustment resistor Rx and the thermistor Rth are connected in serial. The level adjustment resistor Rc, the voltage division adjustment resistor Rx and the thermistor Rth are arranged between a fixed electric potential Vcc and a ground electric potential. An analogue signal as a temperature signal is output to the A/D port 22 from a connection node between the level adjustment resistor Rc and the voltage division adjustment resistor Rx. Also, a protection resistor Rp is provided in just preceding of the A/D port 22.

The thermistor Rth is of a so-called NTC (Negative Temperature Coefficient) type of which the resistance is reduced as the temperature rises. The level adjustment resistor Rc and the voltage division adjustment resistor Rx are adapted to adjust a signal level of the signal input to the A/D port 22 to be a desired level within a desired range.

The priority signal generation section 40 which is a digital signal generation circuit, is configured by, for example, a PNP transistor, a priority signal generation switch SW11 and a resistor as shown in FIG. 1. When the priority signal generation switch SW11 is turned on based on a predetermined control signal, the PNP transistor is turned on so that an ON signal is output to the level shift section 50 via an output resistor connected to a collector terminal of the PNP transistor. Hereinafter, a signal output to the level shift section 50 from the priority signal generation section 40 is referred to as "a priority digital signal" and a state in which a level of the priority digital signal is high, is referred to as "a digital signal ON state".

The level shift section 50 has a transistor Tr1. Here, the transistor Tr1 is of an NPN type. An emitter terminal of the transistor Tr1 is connected to the ground and a collector terminal thereof is connected to an intermediate point in a connection channel between an output terminal of the temperature detection section 30 and the A/D port 22, to be specific, the collector terminal of the transistor Tr1 is connected to a node between the protection resistor Rp and the temperature detection section 30. A base terminal of the transistor Tr1 is connected to the priority signal generation section 40. With this configuration, when the priority digital signal (ON signal) output from the priority signal generation section 40 is input to the base terminal of the transistor Tr1, the transistor Tr1 is turned on. By turning-on of the transistor Tr1, the signal level of the A/D port 22 is lowered to a ground level.

Figure 2:
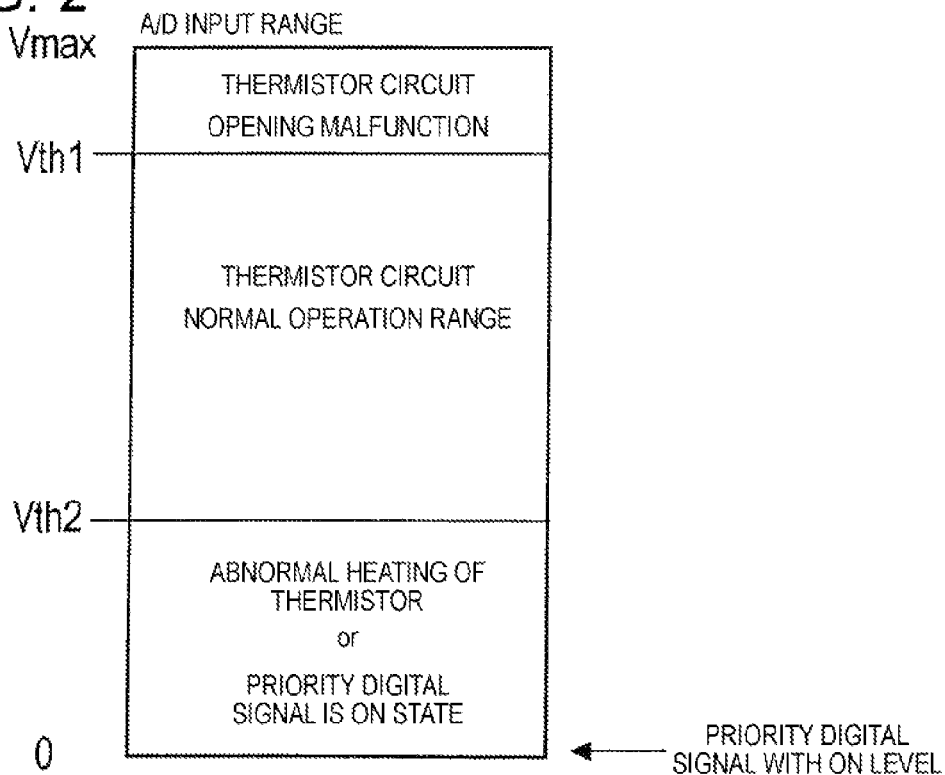
FIG. 2 is an explanatory view showing a criterion of determination of a temperature according to the first embodiment.
Figure 3A:
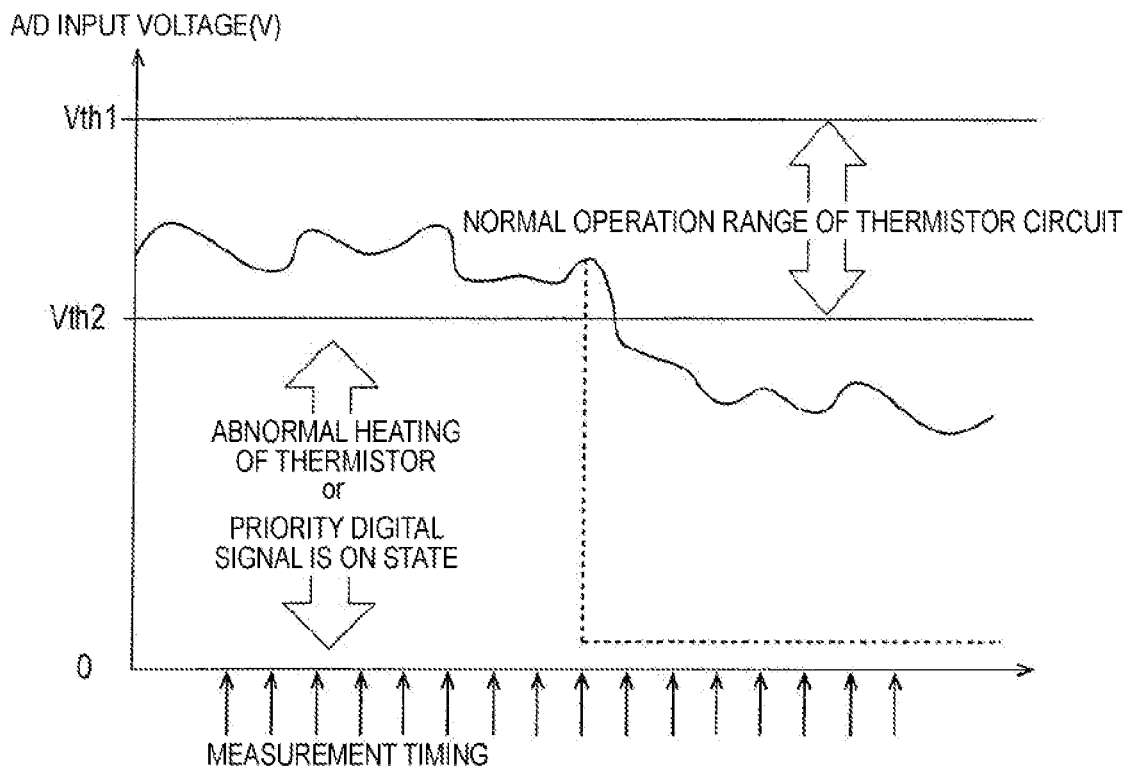
FIGS. 3A and 3B are graphs showing an output of a temperature detection section (a thermistor) to be input to an A/D port of a determination section according to the first embodiment.
Figure 3B:
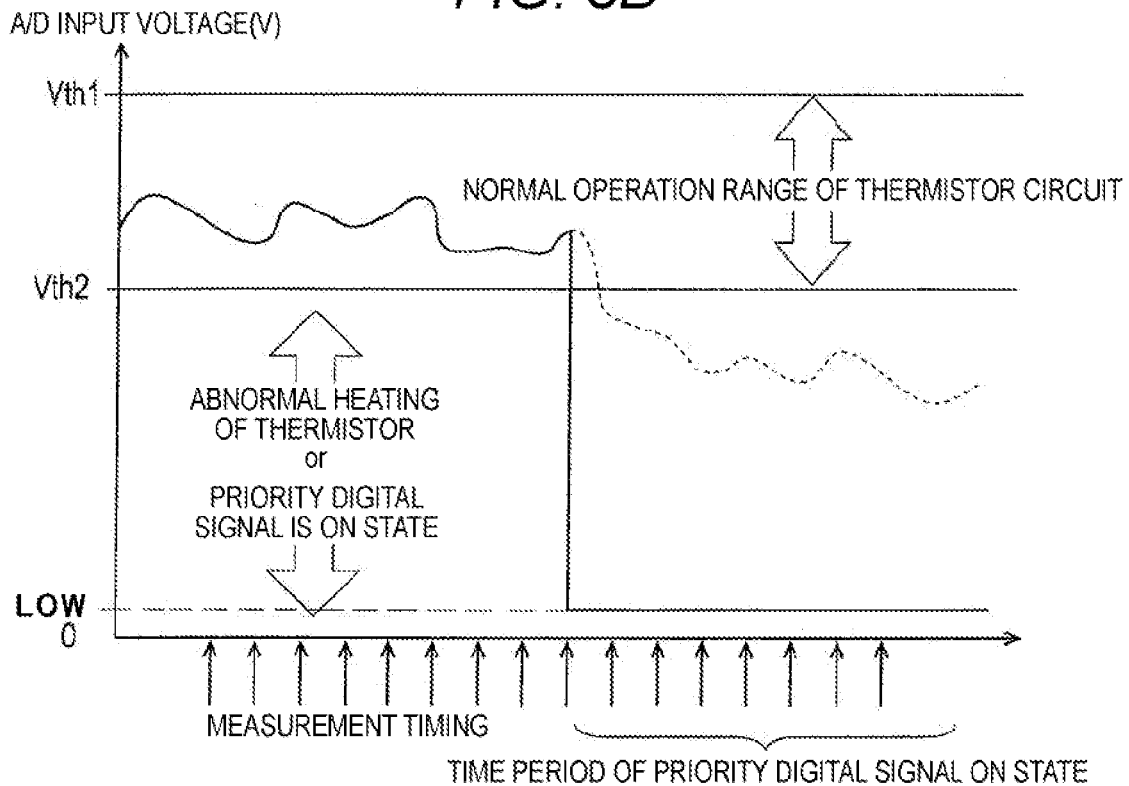

FIG. 2 shows a criterion of signal determination by the determination section 20. FIGS. 3A and 3B show examples of outputs of the temperature detection section 30 (the thermistor Rth) to be input to the A/D port 22 of the determination section 20. FIG. 3A shows a state in which a malfunction occurs on the thermistor Rth in measuring, and FIG. 3B shows a state in which the priority digital signal (ON signal) is output from the priority signal generation section 40 in measuring, that is, the priority digital signal ON state. In accordance with the drawings, an operation of the temperature determination apparatus 10 is described below.

To be specific, when a signal input to the A/D port 22 is within a range between an upper limit threshold value Vth1 and a lower limit threshold value Vth2, the determination section 20 determines that the signal is in a normal operation range of a thermistor circuit, and computes a temperature that is detected by the thermistor Rth based on the input analogue signal and a predetermined table regarding the input analogue signal and the temperature.

When a level of the signal input to the A/D port 22 is equal to or greater than the upper limit threshold value Vth1, the determination section 20 determines that the thermistor Rth has an opening malfunction. That is, in a case where a resistance value of the thermistor Rth becomes equal to or greater than a predetermined value and a level of the detected signal becomes high, namely, it is determined that the signal is in a state approaching the fixed electric potential Vcc, the determination section 20 determines that the thermistor Rth has the opening malfunction due to breaking of a wire or the like.

On the other hand, in a case where the level of the analogue signal input to the A/D port 22 is smaller than the lower limit threshold value Vth2, the determination section 20 determines that abnormal heating of the thermistor occurs or the circuit is in the priority digital signal ON state. To be more specific, in a case where the abnormal heating of the thermistor occurs as shown in FIG. 3A, the level of the signal input to the A/D port 22 becomes smaller than the lower limit threshold value Vth2. At that time, the determination section 20 performs a predetermined process for occurrence of an abnormality. For example, the determination section 20 immediately stops measuring of the A/D port 22 and informs a predetermined control circuit or the like of the fact, the control circuit being adapted to overall control the determination section 20. In a case where the levels of the signals in a plurality of times of measurement are continuously smaller than the lower limit threshold value vth2, the determination section 20 may determine that an abnormality occurs.

Further, in a case where a level of an analogue signal input to the A/D port 22 is in a low level as shown in a time period of the priority digital signal ON state shown in FIG. 3B, the determination section 20 determines that the priority digital signal (ON signal) is output from the priority signal generation section 40 and the transistor Tr1 is turned in an ON state. In this case, the determination section 20 performs a predetermined process which is preset to be operated when the priority signal generation section 40 outputs the priority digital signal (ON signal). As a circumstance that the priority digital signal (ON signal) is output from the priority signal generation section 40, there is, for example, a case of a signal of an operation stop command for avoiding a secondary malfunction when a malfunction or an abnormality occurs on another device.

Here, it is possible to assume that a process against occurrence of an abnormality of the thermistor may be different from a process against the priority digital signal ON state. However, even in a case where the abnormality of the thermistor occurs, the analogue signal may become in the low level the same as in the priority digital signal ON state. In this case, it is possible to make a fluctuation state of becoming in the low level to be a criterion of determination. That is, in a case where the priority signal generation section 40 outputs the priority digital signal (ON signal), the analogue signal substantially changes to be in the low level for a moment. Therefore, in a case where the change speed of the analogue signal to the low level is fast as shown in FIG. 3B, the determination section 20 determines that the A/D port 22 is in the priority digital signal ON state. In a case where the change speed of the analogue signal to the low level is slow, the determination section 20 determines that the abnormality of the thermistor occurs. By adjusting a voltage division adjustment resistor Rx, it is possible to adjust the level of the A/D port 22 in the ON signal state of the priority signal generation section 40.

With the above configuration of the temperature determination apparatus 10, the analogue signal and the digital signal are processed at the identical A/D port 22 in the determination section 20 so that it is possible to miniaturize the temperature determination apparatus 10 by virtue of the reduction of the number of pins.

Second Embodiment

Figures 4, 5:
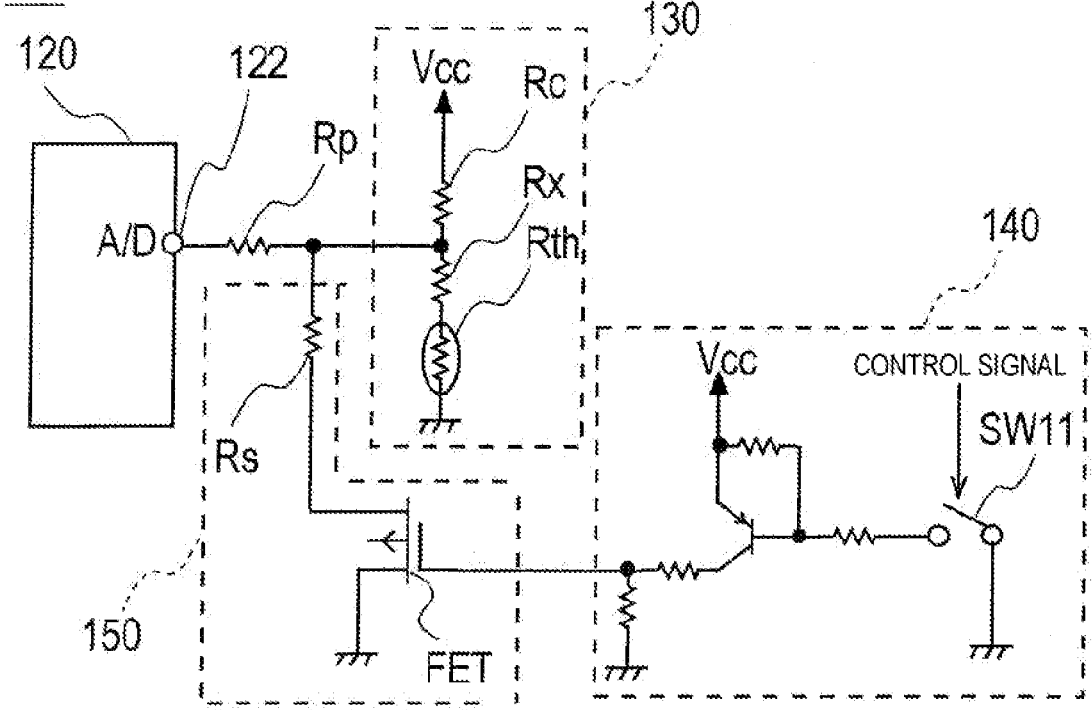
FIG. 4 is a functional block diagram typically showing a temperature determination apparatus according to a second embodiment of the invention.
FIG. 5 is an explanatory view showing a criterion of determination of a temperature according to the second embodiment.

FIG. 4 is a functional block diagram typically showing a temperature determination apparatus 110 according to a second embodiment. The temperature determination apparatus 110 includes a determination section 120, a temperature detection section 130, a priority signal generation section 140 and a level shift section 150. The different features of the temperature determination apparatus 110 with respect to that in the first embodiment are that a MOS field effect transistor (hereinafter, referred to as "FET") is used as a switch section in the level shift section 150 and a resistor Rs for shifting a level of a signal in an A/D port 122 of the determination section 120 is provided. A configuration and an operation of each of the temperature detection section 130 and the priority signal generation section 140 are the same as those of the temperature detection section 30 and the priority signal generation section 40 in the first embodiment, respectively. While the configuration of the determination section 120 is the same as that of the determination section 20, a process such as determination or the like of a signal input to the A/D port 122 is different from that of the signal input to the A/D port 22 in the first embodiment.

The resistor Rs has a resistance value being smaller than that of the voltage division adjustment resistor Rx of the temperature detection section 130. As a result, when the FET is turned on, the level of the analogue signal is not fixed to the low level and is shifted downward under a condition that the resistance of the thermistor Rth is reflected to the level, while the level of the analogue signal in the first embodiment is fixed to the low level. In addition, by using the MOS FET as the switch section, it is possible to eliminate influence due to temperature fluctuation in the switch section, thereby adequately detecting the resistance of the thermistor Rth.

Meanwhile, since the resistance value of the resistor Rs is not necessarily smaller than that of the voltage division adjustment resistor Rx, it is enough that the resistance value thereof is set in such a manner that an operation range in a normal operation state is not overlapped with an operation range in a shifting state.

To be specific, a level Vad1 of the A/D port 122 in the priority digital signal ON state is represented by the following formulas (1) and (2). Meanwhile, resistance values of the resistors are indicated by the respective symbols in the following formulas.

$$Vad1 = Vcc \times Ry/(Rc+Ry) \quad (1)$$

$$Ry = Rs \times (Rx+Rth)/(Rs+Rx+Rth) \quad (2)$$

On the other hand, a level Vad2 of the A/D port 122 in the priority digital signal OFF state is represented by the following formula (3).

$$Vad2 = Vcc \times (Rx+Rth)/(Rc+Rx+Ry) \quad (3)$$

Therefore, it is necessary to set the resistance values of the level adjustment resistor Rc and the voltage division resistor Rx in consideration of the fluctuation range of the resistance value of the adopted thermistor Rth.

Calculation is made in a case where, for example, the resistance values of the thermistor Rth, level adjustment resistor Rc, voltage division adjustment resistor Rx, and resistor Rs, and the value of the fixed voltage Vcc are set as follows (setting example 1).

Setting Example 1

Thermistor Rth: 1.0 kΩ (100° C.) to 170 kΩ (−30° C.)
Level adjustment resistor Rc: 20 kΩ
Voltage division adjustment resistor Rx: 2 kΩ
Resistor Rs: 1.91 kΩ
Vcc: 5V The ranges of the level Vad1 of the A/D port 122 in the priority digital signal ON state and the level Vad2 of the A/D port 122 in the priority digital signal OFF state are as follows.
Vad1: 0.429 V to 0.275V
Vad2: 4.479 V to 0.652V Thus, the ranges of the level Vad1 of the A/D port 122 in the priority digital signal ON state and the level Vad2 of the A/D port 122 in the priority digital signal OFF state are not overlapped with each other, and a value in a range from 0.429 to 0.652 is not involved in any of the above ranges.

The determination section 120 has a predetermined table for calculating out a temperature corresponding to the ranges of the level Vad1 of the A/D port 122 in the priority digital signal ON state and the level Vad2 of the A/D port 122 in the priority digital signal OFF state, and then calculates out the temperature by referring to the table.

Figure 6:
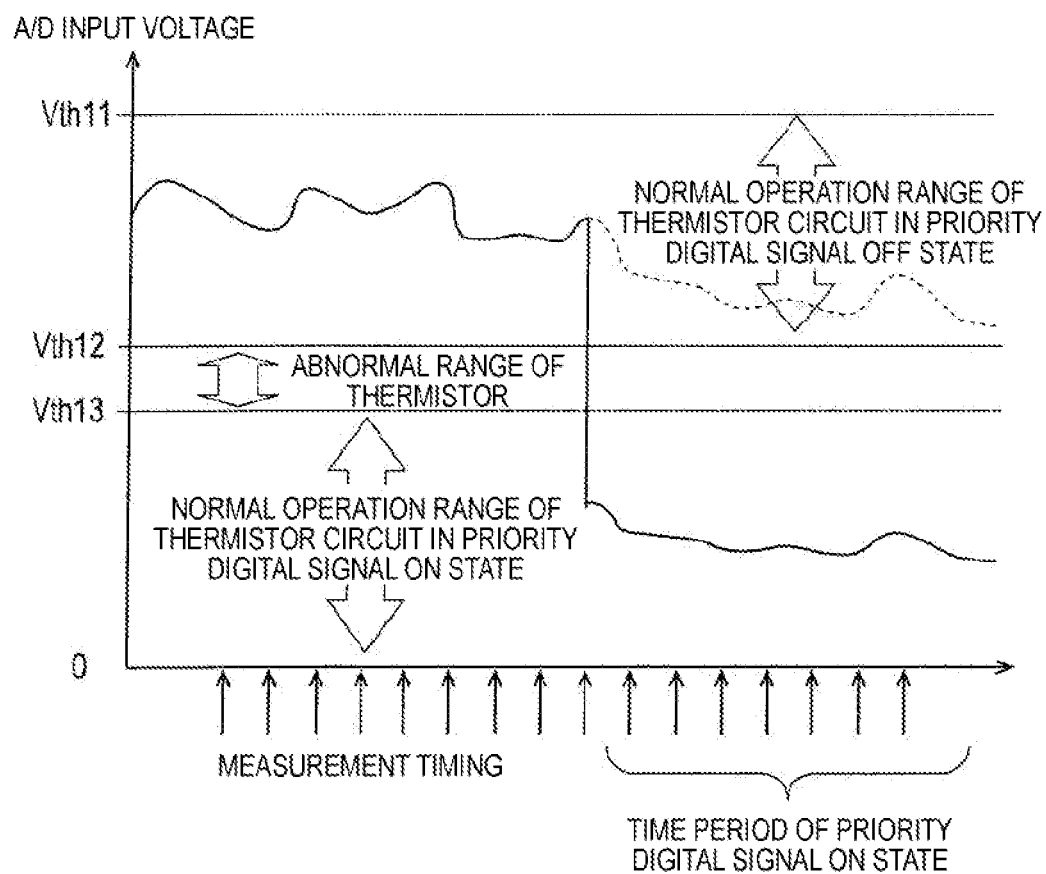
FIG. 6 is a graph showing an output of a temperature detection section (a thermistor) to be input to an A/D port of a determination section according to the second embodiment.

FIG. 5 is an explanatory view showing a criterion of signal determination by the determination section 120. FIG. 6 is a graph showing an example of the output of the temperature detection section (the thermistor Rth) 130 to be input to the A/D port 122 of the determination section 120. FIG. 6 shows a state in which the priority digital signal (ON signal) is output from the priority signal generation section 140 in measuring, that is, the priority digital signal ON state. An operation of the temperature determination apparatus 110 is described below with reference to FIGS. 5 and 6.

As shown in FIG. 5, the determination section 120 makes determination based on the level of the signal input to the A/D port 122. That is, in a case where the level of the signal is greater than an upper limit threshold value vth11, the determination section 120 determines that the thermistor Rth has an opening malfunction. When the level of the signal is in a range from a normal state lower limit threshold value vth12 to the upper limit threshold value vth11 in the normal operation term in the priority digital signal OFF state (the FET is in the OFF state), the determination section 120 calculates out a temperature detected by the thermistor Rth by referring to the table corresponding to the normal operation range of the thermistor circuit. In the above setting example 1, the upper limit threshold value vth11 corresponds to 4.479V and the normal state lower limit threshold value vth12 corresponds to 0.652V.

On the other hand, in a case where the range of the level of the signal in the priority digital signal ON state is smaller than a digital signal ON state threshold value vth13, the determination section 120 determines that the priority digital signal is in the ON state and calculates out a temperature by referring to the table corresponding to the priority digital signal ON state. In this case, the digital signal ON state threshold value vth13 corresponds to 0.429V of the setting example 1. Meanwhile, at that time, the determination section 120 performs a predetermined process corresponding to the priority digital signal ON state. For example, it can be assumed that controlling of operating only minimum necessary functions is performed as the predetermined process. While a dynamic range becomes smaller as compared to a case of the priority digital signal OFF state, the determination section 120 can perform detection of the temperature with certain high precision. In FIG. 6, a signal under a condition made by assuming that the priority signal is in the OFF state in the time period of the priority digital signal ON state is indicated by a dotted line.

In accordance with the second embodiment, a digital signal, for example, a priority digital signal such as an operation stop signal or the like having a functional priority higher than that of a signal based on the resistor value of the thermistor Rth is input to the A/D port 122 for performing an A/D conversion of a signal level (voltage) of the signal based on the resistor value of the thermistor Rth, via the FET and the resistor Rs, so that the signal level of the digital signal can be limited to be within the fluctuation range in the low voltage range of the A/D port 122. At that time, the dynamic range of the A/D input can be assigned in such a manner that a roughly intermediate range is assigned as an information range of an analogue signal in the normal state and a range equal to or lower than a threshold value in which an analogue signal becomes out of an operation of the analogue signal in the normal state is assigned as an ON state determination area of a digital signal. Therefore, during the digital signal OFF state, an analogue signal is input to the A/D port 122 in a normally wide dynamic range. During the digital signal ON state, an analogue signal can be read by limiting the dynamic range to be in the low voltage range equal to or lower than the threshold value. In other words, the A/D dynamic range can be divisionally assigned by a resistor voltage division ratio so that detection of an analogue signal and a digital signal can be efficiently performed by a single port. Consequently, it is possible to achieve reduction of the number of pins of a microcomputer or the like used as the determination section 120.

Thus, the invention is described in accordance with the embodiments. It is understood by a person skilled in the art that modifications or variations of each of the components and the combination thereof can be made, and the modifications or variations can be included in the scope of the invention. The configuration and the process can be applied to not only the temperature determination apparatus but also various circuits by setting an analogue signal and a digital signal so as to allow the A/D dynamic ranges not to be overlapped with each other.

The present application is based on Japanese Patent Application No. 2010-137275 filed on Jun. 16, 2010, the contents of which are incorporated herein by reference.

What is claimed is:

1. A signal determination apparatus, comprising:
a signal detection section comprising an A/D input port;
an analog signal generation section connected to the A/D input port and configured to output an analog signal to the A/D input port;
a priority signal generation circuit configured to generate a priority signal; and
a level shift section configured to shift a level of the analog signal output from the analog signal generation section to a second level range, which is different from a first level range, on the basis of the priority signal,
wherein, when the signal detection section detects that the level of the analog signal is within the first level range, only an output detection process of the analog signal generation section is performed, and
wherein, when the signal detection section detects that the level of the analog signal is within the second level range, both of a process corresponding to the priority signal and the output detection process of the analog signal generation section by referring to a table or a calculation formula corresponding to the second level range are performed.

2. The signal determination apparatus of claim 1, wherein the analog signal generation section comprises a thermistor.

3. The signal determination apparatus of claim 2, wherein:
the thermistor outputs the analog signal based on a resistance value obtained by adding a resistance value of a first resistor connected to the thermistor in series to a resistance value of the thermistor,
the level shift section includes a series circuit having an FET for shifting the level of the analog signal and a second resistor which are connected in series to each other, and
one end of the series circuit is connected to an output terminal of the thermistor, and the other end of the series circuit is connected to a node having an electric potential with a low level.

4. The signal determination apparatus of claim 3, wherein a resistance value of the first resistor and a resistance value of the second resistor are set such that there is no overlapped range between the first level range and the second level range.

5. The signal determination apparatus of claim 4, wherein:
the resistance value of the first resistor and the resistance value of the second resistor are set so that a third level range having a predetermined level width is provided between the first level range and the second level range, and
the signal detection section determines that the thermistor is in an abnormal high temperature state when it is detected that the analog signal output from the thermistor is within the third level range under a condition that the FET is in an OFF state.

6. The signal determination apparatus of claim 1, wherein the process corresponding to the priority signal comprises controlling operation of only minimum necessary functions while stopping a portion of functions of the signal detection section.

* * * * *